United States Patent
Kwon et al.

(10) Patent No.: US 8,788,741 B2
(45) Date of Patent: Jul. 22, 2014

(54) METHOD AND APPARATUS ADAPTED TO PREVENT CODE DATA FROM BEING LOST IN SOLDER REFLOW

(75) Inventors: Jin Hyoung Kwon, Seongnam-si (KR); Hui Kwon Seo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 788 days.

(21) Appl. No.: 12/847,073

(22) Filed: Jul. 30, 2010

(65) Prior Publication Data

US 2011/0107049 A1    May 5, 2011

(30) Foreign Application Priority Data

Nov. 2, 2009  (KR) .................. 10-2009-0105047

(51) Int. Cl.
 *G06F 12/00* (2006.01)
 *G06F 11/00* (2006.01)
 *G11C 11/56* (2006.01)
(52) U.S. Cl.
 CPC .......... *G06F 11/004* (2013.01); *G11C 11/5628* (2013.01)
 USPC .................... 711/103; 711/162; 711/E12.103
(58) Field of Classification Search
 CPC ..................................... G06F 11/004
 USPC .................. 711/103, 115, 154, 162, E12.001, 711/E12.103; 713/1, 2; 365/200
 See application file for complete search history.

(56) References Cited

U.S. PATENT DOCUMENTS

| 6,819,608 | B2 * | 11/2004 | Watanabe ..................... 365/200 |
| 7,245,527 | B2 | 7/2007 | Qureshi et al. |
| 7,523,274 | B2 | 4/2009 | Ryu et al. |
| 2008/0320210 | A1 | 12/2008 | Kim et al. |
| 2009/0175075 | A1 * | 7/2009 | Yeh et al. ................. 365/185.03 |
| 2010/0169547 | A1 * | 7/2010 | Ou .............................. 711/103 |

FOREIGN PATENT DOCUMENTS

| JP | 2006302255 A | 11/2006 |
| JP | 2008546053 A | 12/2008 |
| JP | 2009003934 A | 1/2009 |
| KR | 1020060109042 A | 10/2006 |
| KR | 1020080007470 A | 1/2008 |
| KR | 1020080112069 A | 12/2008 |

* cited by examiner

*Primary Examiner* — Pierre-Michel Bataille
(74) *Attorney, Agent, or Firm* — Volentine & Whitt, PLLC

(57) ABSTRACT

A semiconductor device comprises a first non-volatile memory configured to store program code and a processor configured to copy the program code from the first non-volatile memory to a second non-volatile memory after a solder reflow process. The processor typically copies the program code from the first non-volatile memory to the second non-volatile memory after the processor is completely booted.

17 Claims, 8 Drawing Sheets

METHOD AND APPARATUS ADAPTED TO PREVENT CODE DATA FROM BEING LOST IN SOLDER REFLOW

CROSS-REFERENCE TO RELATED APPLICATIONS

This application claims priority under 35 U.S.C. §119 to Korean Patent Application No. 10-2009-0105047 filed on Nov. 2, 2009, the disclosure of which is hereby incorporated by reference in its entirety.

BACKGROUND

Embodiments of the inventive concept relate generally to semiconductor devices. More particularly, embodiments of the inventive concept relate to methods of preventing code data stored in a semiconductor device from being lost during an infrared (IR) reflow process in which a surface mount device incorporating the semiconductor device is attached to a printed circuit board.

Solder reflow is a process in which a solder paste is used to attach surface mount devices (SMDs) to a printed circuit board (PCB) and then melted to electrically connect the SMDs to the PCB. The solder reflow typically comprises IR reflow using an infrared lamp, or convection reflow using convection.

Under certain circumstances, the IR reflow or convection reflow can modify data stored in semiconductor devices within the SMDs. This is particularly true of certain types of semiconductor devices such as phase change memories. The modification of data can lead to errors in operation of the semiconductor devices.

SUMMARY

Selected embodiments of the inventive concept provide methods and apparatuses adapted to prevent code data from being lost in a solder reflow process.

According to one embodiment of the inventive concept, a method is provided for managing program code in a semiconductor device comprising a first non-volatile memory and a second non-volatile memory. The method comprises writing the program code to the first non-volatile memory before a solder reflow process is performed, and copying the program code from the first non-volatile memory to a second non-volatile memory after the solder reflow process is performed.

In certain embodiments, the second non-volatile memory is a phase-change memory. In certain embodiments, the method further comprises deleting the program code from the first non-volatile memory after completely copying the program code to the second non-volatile memory. In certain embodiments, the method further comprises operating a central processing unit to store the program code in a shared memory bank of a multi-port memory device, and operating a processor to copy the program code from the shared memory bank to a second memory bank of the multi-port memory device, and then to write the program code from the shared memory bank to the first non-volatile memory.

According to another embodiment of the inventive concept, a semiconductor device comprises a first non-volatile memory configured to store program code, and a processor configured to copy the program code from the first non-volatile memory to a second non-volatile memory after a solder reflow process is performed.

In certain embodiments, the processor is configured to copy the program code from the first non-volatile memory to the second non-volatile memory after the processor is completely booted. In certain embodiments, the processor is configured to delete the program code from the first non-volatile memory after the program code is completely copied to the second non-volatile memory. In certain embodiments, the second non-volatile memory is a phase-change memory. In certain embodiments, the semiconductor device is a multi-chip package semiconductor device. In certain embodiments, the solder reflow process comprises infrared reflow. In certain embodiments, the semiconductor device further comprises a multiport memory device comprising a shared bank memory accessed by a central processing unit or the processor according to an access authority, wherein the central processing unit outputs the program code and controls writing of the program code to the shared bank memory and the processor controls writing of the program code from the shared bank memory to the first non-volatile memory.

According to another embodiment of the inventive concept, a semiconductor system comprises a semiconductor device, and a central processing unit configured to control operation of the semiconductor device, wherein the semiconductor device comprises a first non-volatile memory configured to store a program code, and a processor configured to copy the program code from the first non-volatile memory to a second non-volatile memory after a solder reflow process is performed.

In certain embodiments, the semiconductor device further comprises a first memory bank configured to be accessed by the central processing unit, a second memory bank configured to be accessed by the processor, and a shared memory bank configured to be accessed by the central processing unit or the processor according to an access authority, wherein the program code is input to the semiconductor device and written to the shared memory bank, and processor controls writing of the program code from the shared memory bank to the first non-volatile memory. In certain embodiments, the second non-volatile memory is a phase-change memory. In certain embodiments, the semiconductor device is a multi-chip package semiconductor device. In certain embodiments, the solder reflow process is infrared reflow. In certain embodiments, the processor deletes the program code from the first non-volatile memory after the program code is completely copied to the second non-volatile memory. In certain embodiments, the semiconductor system is one of a mobile telephone, a smart phone, a personal digital assistant, a portable multimedia player, and an information technology device. In certain embodiments, the semiconductor system is a digital camera. In certain embodiments, the semiconductor system is a memory card.

BRIEF DESCRIPTION OF THE DRAWINGS

The attached drawings illustrate various embodiments of the inventive concept. In the drawings, like reference numbers denote like features.

DETAILED DESCRIPTION OF THE EMBODIMENTS

Embodiments of the inventive concept are described below with reference to the accompanying drawings. These embodiments are presented as teaching examples and should not be construed to limit the scope of the inventive concept.

In the description that follows, where an element is referred to as being "connected" or "coupled" to another element, it can be directly connected or coupled to the other element or intervening elements may be present. In contrast, where an element is referred to as being "directly connected" or "directly coupled" to another element, there are no intervening elements present. As used herein, the term "and/or" includes any and all combinations of one or more of the associated listed items and may be abbreviated as "/".

Although the terms first, second, etc. may be used herein to describe various elements, the described elements should not be limited by these terms. Rather, these terms are merely used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" where used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms use herein, including technical and scientific terms, have the same meaning as commonly understood by one of ordinary skill in the art to which the inventive concept belongs. It will be further understood that terms such as those defined in commonly used dictionaries should be interpreted as having a meaning that is consistent with their meaning in the context of the relevant art and/or the present application, and will not be interpreted in an idealized or overly formal sense unless expressly so defined herein.

Figure 1:
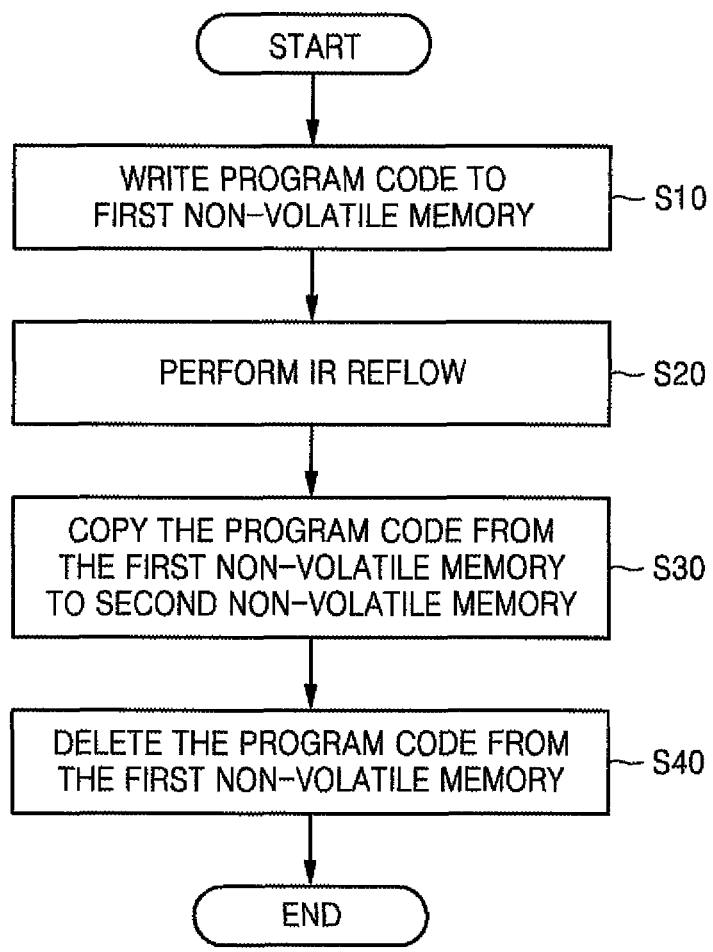
FIG. 1 is a flowchart illustrating a method of operating a semiconductor device according to an embodiment of the inventive concept.
Figure 2:
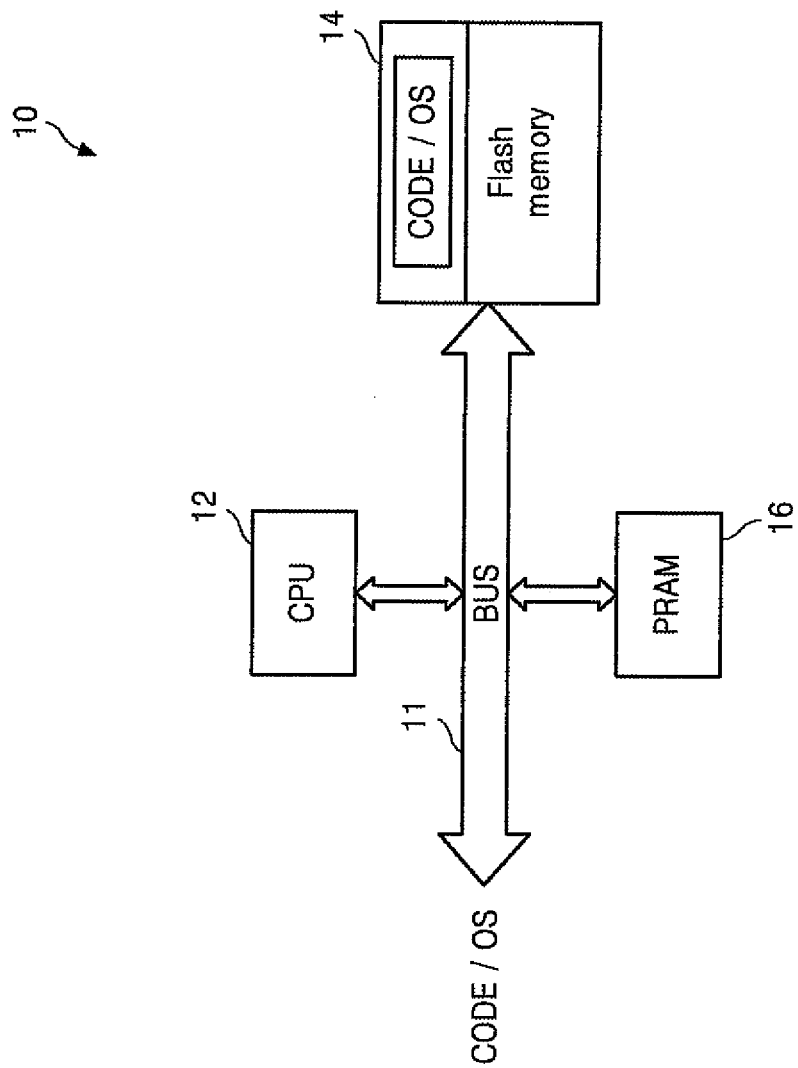
FIG. 2 is a block diagram illustrating a method of writing program code to a flash memory before an IR reflow process according to an embodiment of the inventive concept.
Figure 3:
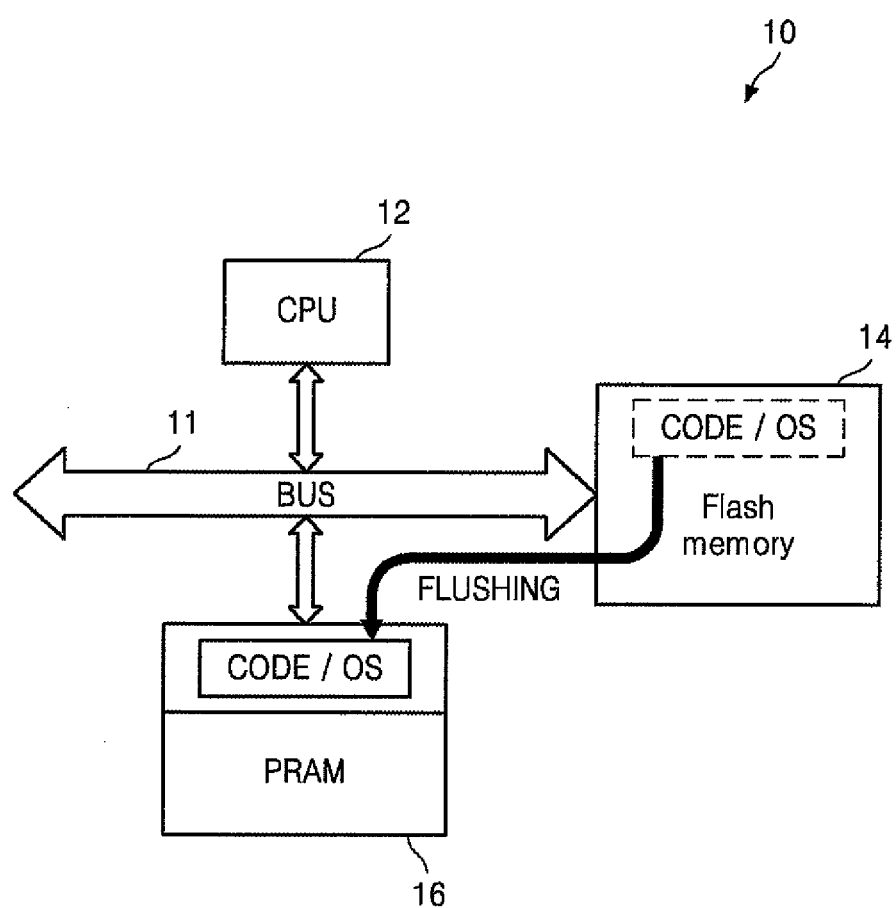
FIG. 3 is a block diagram illustrating a method of writing program code from a flash memory to a phase-change random access memory (PRAM) after the IR reflow process according to an embodiment of the inventive concept.

FIG. 1 is a flowchart illustrating a method of operating a semiconductor device according to an embodiment of the inventive concept. FIG. 2 is a block diagram illustrating a method of writing program code to a flash memory before an IR reflow process according to an embodiment of the inventive concept. FIG. 3 is a block diagram illustrating a method of writing program code from a flash memory to a phase-change random access memory (PRAM) after the IR reflow process according to an embodiment of the inventive concept.

Referring to FIGS. 1 through 3, a semiconductor device 10 comprises a central processing unit (CPU) 12, a first non-volatile memory 14, and a second non-volatile memory 16. In an operation S10, program code is written to a particular region in first non-volatile memory 14 under the control of CPU 12. In this embodiment, it is assumed that first non-volatile memory 14 comprises a flash memory or another type of electrically erasable programmable read-only memory (EEPROM).

Thereafter, in an operation S20, IR reflow is performed to connect semiconductor device 10 to a printed circuit board (PCB). The IR reflow is a process that electrically fixes semiconductor device 10 to the PCB by a heat transfer method using a heat source such as an IR lamp.

After the IR reflow process, semiconductor device 10 is booted. Then, in an operation S30, the program code is written from first non-volatile memory 14 to a particular region of second non-volatile memory 16 through a bus 11 under the control of CPU 12. Operation S30 can be referred to as a copying or flushing operation. In this embodiment, second non-volatile memory 16 comprises a phase-change memory, such as a PRAM.

Next, in an operation S40, the program code in first non-volatile memory 14 is deleted under the control of CPU 12. This allows user data to be stored in the region of first non-volatile memory 14 where the program data was stored. Some embodiments omit operation S40.

Figure 4:
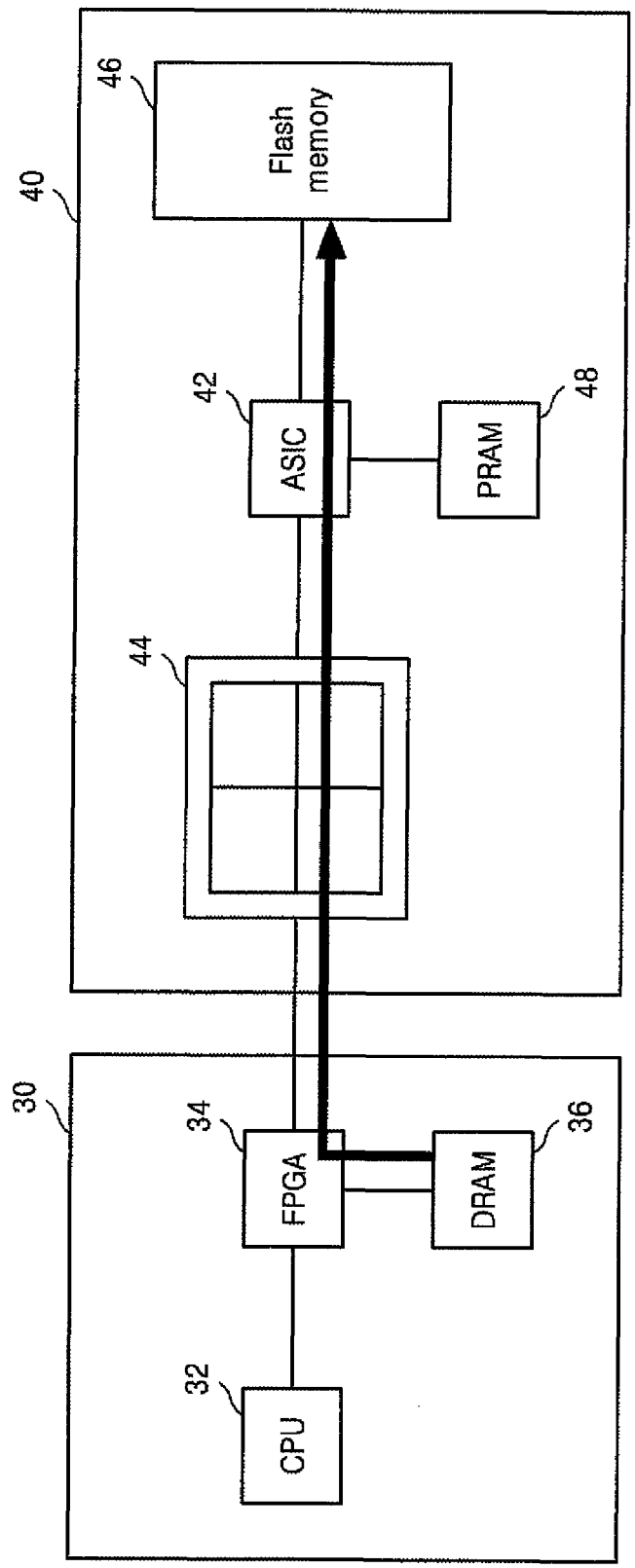
FIG. 4 is a block diagram illustrating a method of writing program code to a flash memory using write equipment according to an embodiment of the inventive concept.

FIG. 4 is a block diagram illustrating a method of writing program code to a flash memory using write equipment 30 according to an embodiment of the inventive concept. Write equipment 30 programs the program code to a semiconductor device 40 before an IR reflow process. Write equipment 30 comprises a CPU 32, a logic chip (e.g., a field-programmable gate array (FPGA)) 34 performing a program operation, and a memory 36.

Logic chip 34 functions as a processor to write program code stored in memory 36 to a first non-volatile memory 46 within semiconductor device 40. CPU 32 controls the overall operation of write equipment 30 and controls the operation of logic chip 34 as well. Logic chip 34 transmits data, such as program code, from memory 36 to semiconductor device 40 under the control of CPU 32. Alternatively, logic chip 34 can transmit the data without the control of CPU 32.

Memory 36 typically comprises a plurality of volatile memory cells, such as dynamic random access memory (DRAM) cells. Data stored in memory 36 typically comprises code data, a boot loader, a flash translation layer (FTL) code, an operating system (OS) image, or a file comprising the OS.

Before IR reflow is performed, program code output from memory 36 of write equipment 30 is transmitted to an application-specific integrated circuit (ASIC) 42 of semiconductor device 40 through a shared memory bank included in a multiport memory device 44 and then written to first non-volatile memory 46 under the control of ASIC 42.

Figure 5:
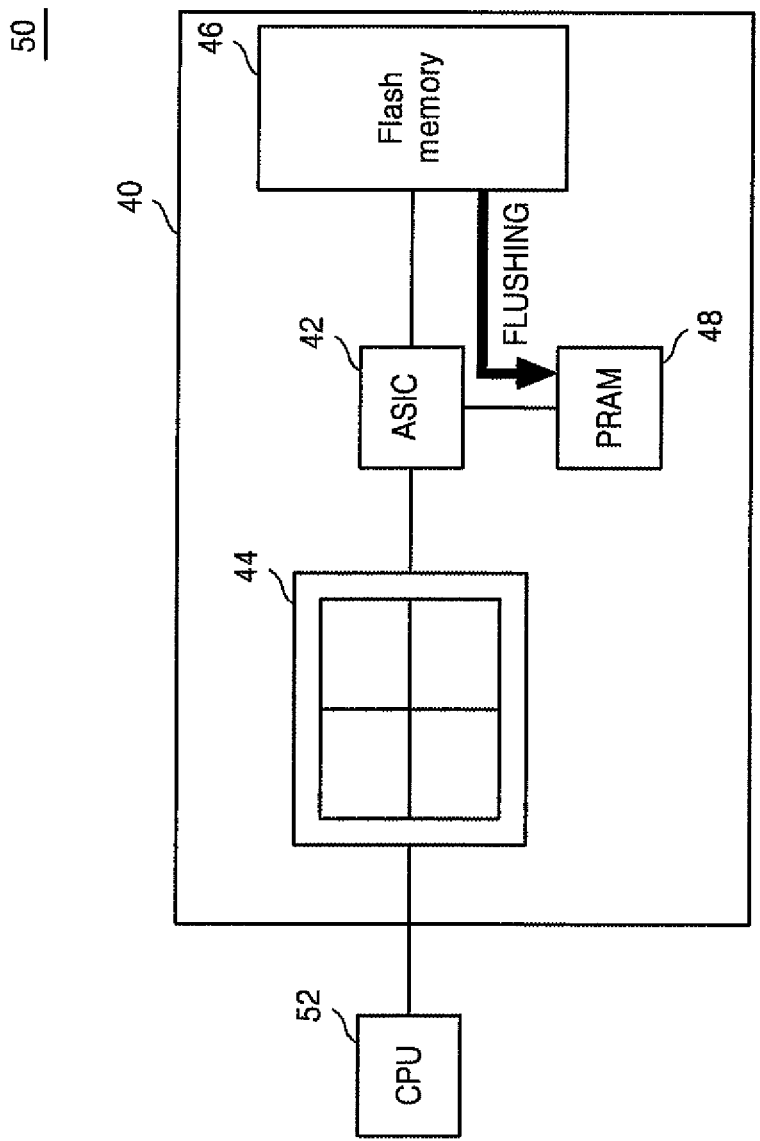
FIG. 5 is a block diagram of a memory system according to an embodiment of the inventive concept.

FIG. 5 is a block diagram of a semiconductor system 50 according to an embodiment of the inventive concept. Referring to FIG. 5, semiconductor system 50 comprises semiconductor device 40 and a first processor in the form of a CPU 52. In this embodiment, first non-volatile memory 46 comprises a flash memory or another type of EEPROM, and second non-volatile memory 48 comprises a phase-change memory. Each memory comprises at least one memory chip comprising a plurality of memory cells.

Where power is supplied to semiconductor device 40 after IR reflow is performed to electrically connect semiconductor device 40 to a PCB, ASIC 42 completes booting and then writes a program code from first non-volatile memory 46 to second non-volatile memory 48. In some embodiments, ASIC 42 deletes the program code from first non-volatile memory 46 after completing the writing to second non-volatile memory 48. The booting performed by ASIC 42 constitutes initial booting performed after the IR reflow.

In some embodiments, multiport memory device 44, ASIC 42, first non-volatile memory 46, and second non-volatile memory 48 are implemented in separate chips. Alternatively, some or all of multiport memory device 44, ASIC 42, first non-volatile memory 46, and second non-volatile memory 48 can be implemented in a single semiconductor device 40 referred to as a memory link architecture (MLA). In addition, semiconductor device 40 can be implemented in a multi-chip package (MCP).

In various alternative embodiments, semiconductor system 50 can comprise, for instance, a data processing system, a personal computer (PC), a net-book, a notebook PC, a mobile telephone, a smart phone, a personal digital assistant (PDA), a portable multimedia player (PMP), a memory card, consumer equipment (CE), or an information technology (IT) device. The CE can comprise, for instance, a digital television (TV), an internet protocol TV (IPTV), a refrigerator, a home automation system, a navigation device, or a washing machine.

Figure 6:
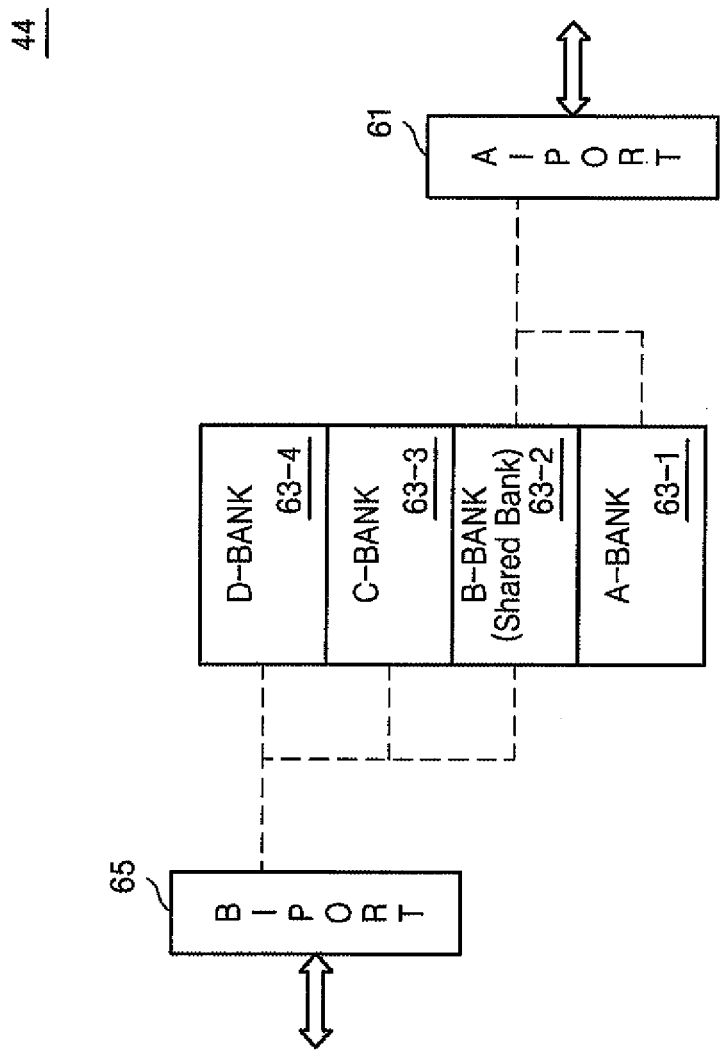
FIG. 6 is a schematic block diagram of a multiport memory device illustrated in FIG. 5.

FIG. 6 is a schematic block diagram of the multiport memory device illustrated in FIG. 5. Referring to FIGS. 4 through 6, multiport memory device 44 comprises a first port or an A-port 61 connected to ASIC 42, a plurality of memory banks 63-1, 63-2, 63-3, and 63-4, and a second port or a B-port 65 connected to CPU 52.

First port 61 and second port 65 are controllers or interfaces which can transmit and receive data according to a DRAM protocol. Memory bank 63-1 is a dedicated memory bank that can be accessed only by ASIC 42 through first port 61. Memory banks 63-3 and 63-4 are dedicated memory banks that can be accessed only by CPU 52 through second port 65. Memory bank 63-2 is a shared memory bank that can be accessed by ASIC 42 through first port 61 or by CPU 52 through second port 65 according to access authority. Multiport memory device 44 can process (e.g., read or write) data according to the DRAM protocol.

Figure 7:
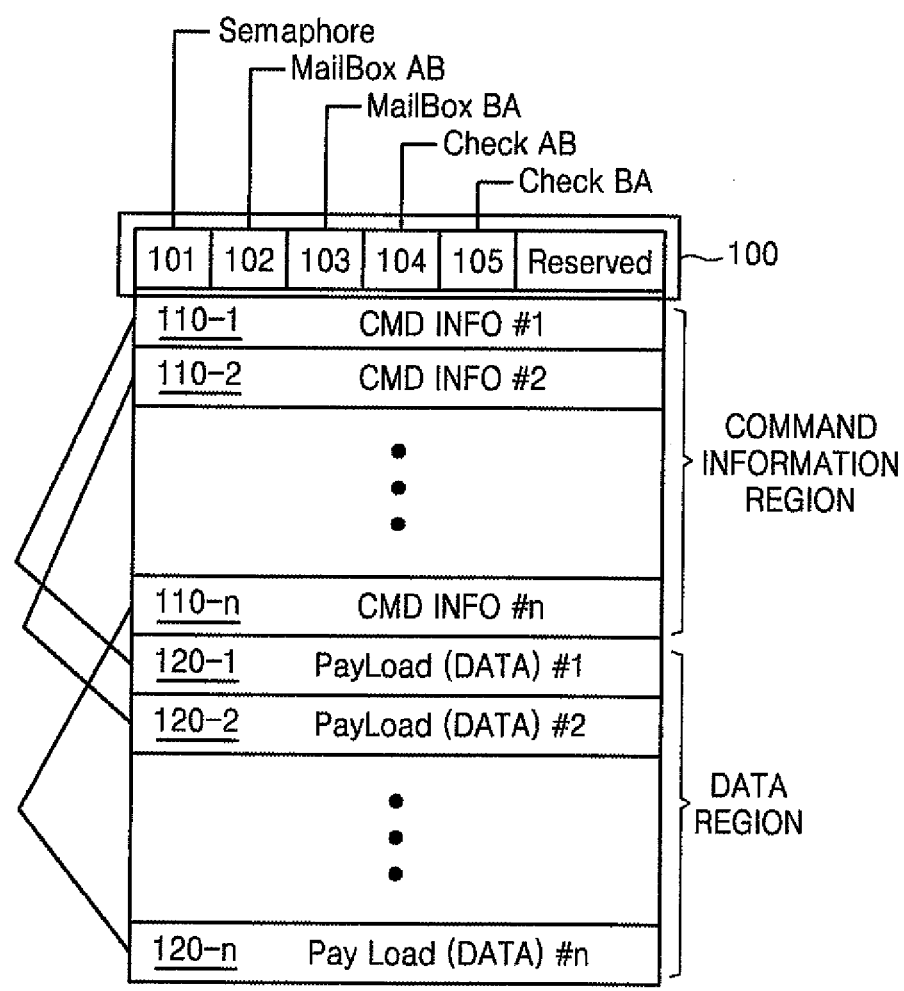
FIG. 7 is a schematic diagram of a memory map of a shared memory bank illustrated in FIG. 6.

FIG. 7 is a schematic diagram of a memory map of shared memory bank 63-2 illustrated in FIG. 6. Referring to FIGS. 4 through 7, shared memory bank 63-2 comprises a plurality of registers 100. Registers 100 comprise internal registers 101 through 105 and reserved registers (labeled "Reserved"). The total size of registers 100 typically corresponds to a single row size, e.g., N-kilobytes (KB), where N is a natural number. For example, in some embodiments, the size of internal registers is 2 KB (N=2).

Where a particular row address output from CPU 52 is input to multiport memory device 44, a particular region in shared memory bank 63-2 is disabled and internal registers 101 through 105 are enabled. Internal registers 101 through 105 comprise a semaphore register 101, mailbox registers 102 and 103, and check registers 104 and 105. Internal registers 101 through 105 can be used to resolve a conflict situation that arises where CPU 52 and ASIC 42 access shared memory bank 63-2 at the same time and support access authority and permission for data transmission between first port 61 and second port 65.

Semaphore register 101 stores a bit indicating which of first and second ports 61 and 65 has access authority for shared memory bank 63-2. For instance, a value of "1" stored in semaphore register 101 can be used to indicate that second port 65 has access authority for shared memory bank 63-2 and a value of "0" stored in semaphore register 101 can be used to indicate that first port 61 has access authority for shared memory bank 63-2, or vice versa. A value stored in semaphore register 101 can be written only by a port having access authority. Semaphore register 101 can be a 1-bit register or 2-bit register, but the inventive concept is not restricted thereto.

Mailbox registers 102 and 103 can be used to transmit messages, such as the position and size of data to be written or read and a command. As examples, to transmit a message from ASIC 42 connected to first port 61 to CPU 52 connected to second port 65, mailbox register 102 (or mailbox AB) can be written by ASIC 42 and read by CPU 52. Alternatively, to transmit a message from CPU 52 connected to second port 65 to ASIC 42 connected to first port 61, mailbox register 103 (or mailbox BA) can be written by CPU 52 and read by ASIC 42.

Where a message is written to either of mailbox registers 102 and 103, an interrupt signal may occur. The interrupt signal is typically active-low. Where a message is written to mailbox register 102, an interrupt signal is transmitted to CPU 52 through second port 65. Then, CPU 52 reads the message from mailbox register 102 in response to the interrupt signal and reads command information from a first command information region 110-1 and/or a payload or data from a first data region 120-1 according to a result of decoding the message.

Where a message is written to mailbox register 103, an interrupt signal is transmitted to ASIC 42 through first port 61. ASIC 42 reads the message from mailbox register 103 in response to the interrupt signal and reads command information from a second command information region 110-2 and/or a payload or data from a second data region 120-2 according to a result of decoding the message.

A value of each check register 104 or 105 can indicate whether a message written in one of mailbox registers 102 and 103 has been read by an opposite port. The values of the respective check registers 104 and 105 can be automatically changed according to read/write commands output from mailbox registers 102 and 103, respectively. For instance, where ASIC 42 connected to first port 61 outputs a write command to mailbox register 102, the value of check register 104 can be set to "1" and where CPU 52 connected to second port 65 outputs a read command to mailbox register 102, the value of check register 104 can be set to "0", or vice versa.

A procedure in which the access authority for shared memory bank 63-2 is transferred from CPU 52 to ASIC 42 is described below in further detail with reference to FIGS. 5 through 7.

In the procedure, the value of semaphore register 101 is initially set to "1". Accordingly, CPU 52 can access dedicated memory banks 63-3 and 63-4 and shared memory bank 63-2 as well through second port 65, and ASIC 42 can access dedicated memory bank 63-1 but not shared memory bank 63-2.

CPU 52 reads the value (i.e., "1") of semaphore register 101 through second port 65 to check the access authority for the shared memory bank 63-2. Then, ASIC 42 writes a message requesting to change the access authority for the shared memory bank 63-2 to mailbox register 102 through first port 61. Subsequently, an interrupt signal is activated, e.g., by assuming an active-low level to inform CPU 52 that a message has been written to mailbox register 102. Thereafter, CPU 52 reads the message from mailbox register 102 through second port 65 in response to the activated interrupt signal. Then, CPU 52 changes the value of semaphore register 101 from "1" to "0" through second port 65 and writes to mailbox register 103 a message indicating that the value of semaphore register 101 has been changed from "1" to "0". Next, an activated interrupt signal is transmitted to ASIC 42, and ASIC 42 reads the message from mailbox register 103 through first port 61 in response to the activated interrupt signal.

ASIC 42 then reads the value (i.e., "0") of semaphore register 101 through first port 61 and confirms that the access authority for shared memory bank 63-2 has been changed. Thereafter, ASIC 42 accesses shared memory bank 63-2 through first port 61.

Referring to FIG. 7, command information output from CPU 52 or ASIC 42, such as a read command and a read address or a write command and a write address, are stored in respective command information regions 110-1 through 110-n and data regions 120-1 through 120-n. First command information region 110-1 corresponds to first data region 120-1, second command information region 110-2 corresponds to second data region 120-2, and n-th command information region 110-n corresponds to n-th data region 120-n.

CPU 32 or logic chip 34 illustrated in FIG. 4 has the access authority for the shared memory bank 63-2 and a program code output from CPU 32 or logic chip 34 is stored in shared memory bank 63-2. Thereafter, access authority for shared memory bank 63-2 is transferred (or hand over) from CPU 32 or logic chip 34 to ASIC 42. Then, ASIC 42 accesses shared memory bank 63-2 and reads the program code from shared memory bank 63-2. ASIC 42 writes the program code to first non-volatile memory 46.

Figure 8:
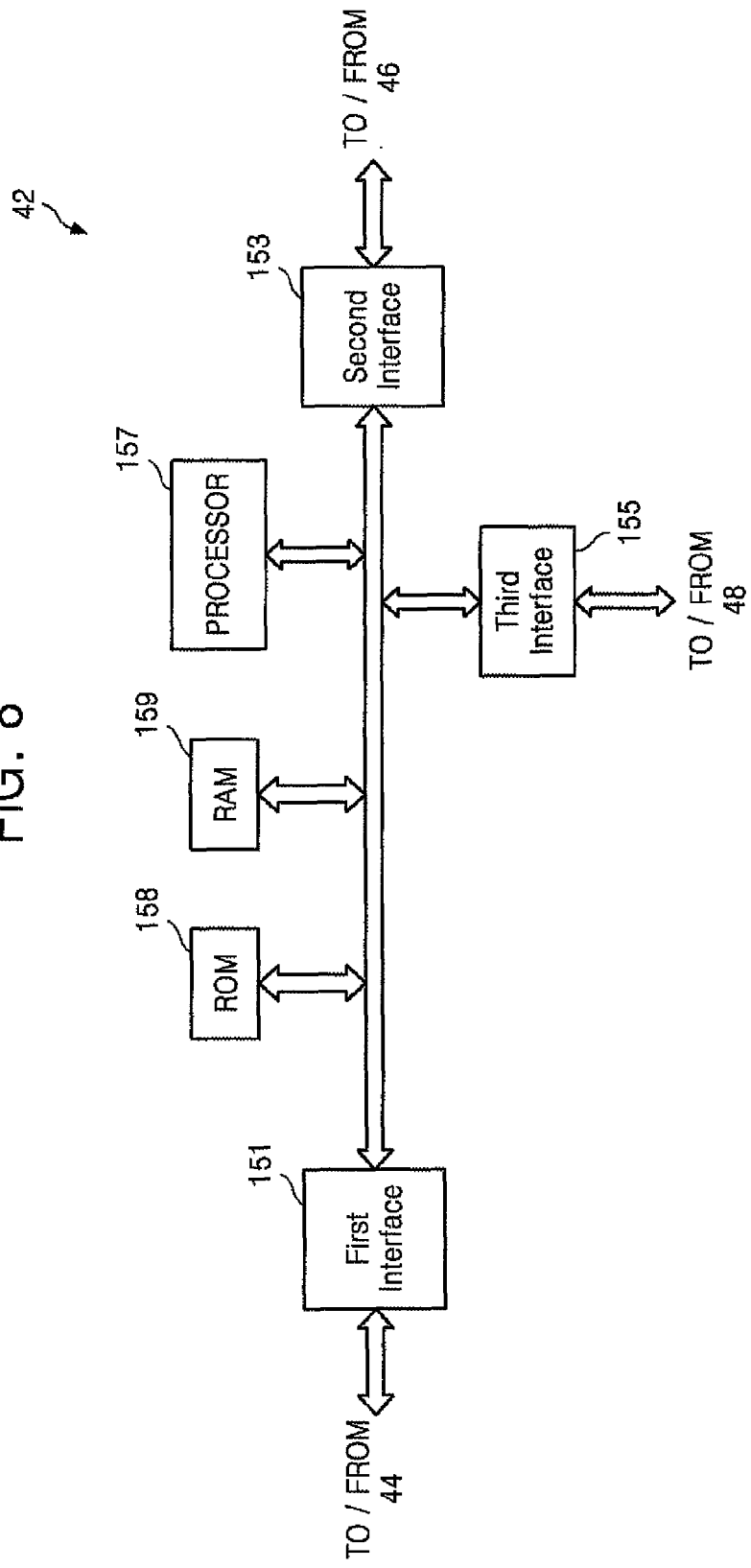
FIG. 8 is a block diagram of an application-specific integrated circuit (ASIC) illustrated in FIG. 5.

FIG. 8 is a block diagram of an embodiment of ASIC 42 illustrated in FIG. 5. Referring to FIG. 8, ASIC 42 comprises a main processor 157, a plurality of interfaces 151, 153, and 155, a read-only memory (ROM) 158, and a random access memory (RAM) 159.

In a booting operation, main processor 157 reads boot code from ROM 158, writes (or copies) the boot code to RAM 159, and performs the boot operation using the boot code stored in RAM 159. Main processor 157 also executes a program code which is stored in ROM 158 and is necessary for the operation of semiconductor device 40. First interface 151 typically comprises a controller that can transmit or receive command information, such as read or write command information, an address, such as a read or write address, or data, such as read data, write data, or program code, to or from first port 61 illustrated in FIG. 6.

First interface 151 transmits or receives command information, an address, data, or a program code to or from first port 61 in compliance with main processor 157. First interface 151 typically comprises a controller or an interface that can support or use a DRAM protocol. Second interface 153 typically comprises a controller or an interface that can transmit or receive command information, an address, data, or a program code to or from first non-volatile memory 46 according to a protocol of first non-volatile memory 46.

First non-volatile memory 46 typically comprises a plurality of non-volatile memories, and each of the plurality of non-volatile memories typically comprises a non-volatile memory cell. In various embodiments, the non-volatile memory cells can be EEPROM cells, flash memory cells, magnetic RAM (MRAM) cells, spin-transfer torque MRAM cells, conductive bridging RAM (CBRAM) cells, ferroelectric RAM (FeRAM) cells, resistive RAM (RRAM or ReRAM) cells, nanotube PRAM cells, polymer RAM (PoRAM) cells, nano floating gate memory (NFGM) cells, holographic memory cells, molecular electronic memory cells, or insulator resistance change memory cells. Moreover, in some embodiments, the various non-volatile memory cells can be configured to store more than one bit of data per cell.

Second interface 153 typically comprises a controller or an interface supporting or using a communication protocol that allows data or program code to be transmitted to or received from first non-volatile memory 46. In other words, second interface 153 typically comprises a controller or interface that can support or use a communication protocol suitable for non-volatile memory cells in first non-volatile memory 46.

Third interface 155 typically comprises a controller or interface that can transmit or receive command information, an address, data, or a program code to or from second non-volatile memory 48. For instance, third interface 155 can be a controller or an interface that can transmit or receive command information, an address, data, or a program code to or from a phase-change memory. In some embodiments, third interface 155 is implemented by a low-power double-data-rate 2 (LPDDR2) interface or a NOR interface.

After an IR reflow process is carried out on semiconductor device 40, where power is supplied to semiconductor device 40 and ASIC 42, main processor 157 controls ASIC 42 to perform a boot operation so that a program code stored in first non-volatile memory 46 is written or flushed to a particular region of second non-volatile memory 48.

CPU 52 outputs an address indicating the particular region of second non-volatile memory 48 when accessing the program code. Accordingly, ASIC 42 analyzes the address received through multiport memory device 44 from CPU 52 and accesses the particular region of the second non-volatile memory 48 based on the analysis.

Before the IR reflow process, semiconductor device 10 or 40 writes program code to first non-volatile memory 46. After the IR reflow process, semiconductor device 10 or 40 writes the program code from first non-volatile memory 46 to second non-volatile memory 48, which is a phase-change memory.

As indicated by the foregoing, in some embodiments of the inventive concept, a semiconductor device 10 or 40 prevents program code or code data stored in a PRAM from being lost due to heat after an IR reflow process due to the characteristics of the PRAM.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of managing program code in a semiconductor device comprising a first non-volatile memory and a second non-volatile memory separate from the first non-volatile memory device, the method comprising:

writing the program code to the first non-volatile memory before a solder reflow process is performed to connect the semiconductor device to a substrate;

copying the program code from the first non-volatile memory to a second non-volatile memory after the solder reflow process is performed;

operating a central processing unit (CPU) to store the program code in a shared memory bank of a multi-port memory device; and operating a processor to copy the program code from the shared memory bank to a second memory bank of the multi-port memory device, and then to write the program code from the shared memory bank to the first non-volatile memory, which is different from the multi-port memory device.

2. The method of claim 1, wherein the second non-volatile memory is a phase-change memory.

3. The method of claim 1, further comprising deleting the program code from the first non-volatile memory after completely copying the program code to the second non-volatile memory.

4. A semiconductor device comprising:
a first non-volatile memory configured to store program code;
a processor configured to copy the program code from the first non-volatile memory to a second non-volatile memory separate from the first non-volatile memory after a solder reflow process is performed to connect the semiconductor device to a substrate; and
a multiport memory device comprising a shared bank memory accessed by a central processing unit (CPU) or the processor according to an access authority, wherein the CPU outputs the program code and controls writing of the program code to the shared bank memory and the processor controls writing of the program code from the shared bank memory to the first non-volatile memory, which is different from the multi-port memory device.

5. The semiconductor device of claim 4, wherein the processor is configured to copy the program code from the first non-volatile memory to the second non-volatile memory after the processor is completely booted.

6. The semiconductor device of claim 4, wherein the processor is configured to delete the program code from the first non-volatile memory after the program code is completely copied to the second non-volatile memory.

7. The semiconductor device of claim 4, wherein the second non-volatile memory is a phase-change memory.

8. The semiconductor device of claim 4, wherein the semiconductor device is a multi-chip package (MCP) semiconductor device.

9. The semiconductor device of claim 4, wherein the solder reflow process comprises infrared (IR) reflow.

10. A semiconductor system comprising:
a semiconductor device; and
a central processing unit (CPU) configured to control operation of the semiconductor device,
wherein the semiconductor device comprises:
a first non-volatile memory configured to store a program code; and
a processor configured to copy the program code from the first non-volatile memory to a second non-volatile memory separate from the first non-volatile memory after a solder reflow process is performed to connect the semiconductor memory device to a substrate;
wherein the semiconductor device further comprises:
a first memory bank configured to be accessed by the CPU;
a second memory bank configured to be accessed by the processor; and
a shared memory bank different from the first non-volatile memory and configured to be accessed by the CPU or the processor according to an access authority,
wherein the program code is input to the semiconductor device and written to the shared memory bank, and processor controls writing of the program code from the shared memory bank to the first non-volatile memory.

11. The semiconductor system of claim 10, wherein the second non-volatile memory is a phase-change memory.

12. The semiconductor system of claim 10, wherein the semiconductor device is a multi-chip package (MCP) semiconductor device.

13. The semiconductor system of claim 10, wherein the solder reflow process is infrared (IR) reflow.

14. The semiconductor system of claim 10, wherein the processor deletes the program code from the first non-volatile memory after the program code is completely copied to the second non-volatile memory.

15. The semiconductor system of claim 10, wherein the semiconductor system is one of a mobile telephone, a smart phone, a personal digital assistant (PDA), a portable multimedia player (PMP), and an information technology (IT) device.

16. The semiconductor system of claim 10, wherein the semiconductor system is a digital camera.

17. The semiconductor system of claim 10, wherein the semiconductor system is a memory card.

* * * * *